(12) United States Patent
Hwang et al.

(10) Patent No.: US 6,432,539 B1
(45) Date of Patent: *Aug. 13, 2002

(54) PHOSPHORUS-CONTAINING POLYMER HAVING PHENOLIC UNITS AND USES THEREOF

(75) Inventors: Kuen-Yuan Hwang; Hong-Hsing Chen; An-Pang Tu; Ying-Ling Liu, all of Hsinchu Industrial District (TW)

(73) Assignee: Chang Chun Plastics Co. Ltd., Taipei (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/431,435

(22) Filed: Nov. 1, 1999

(51) Int. Cl.[7] .............................. C08L 63/04; C08G 8/28; C08G 8/10
(52) U.S. Cl. .................. 428/413; 525/480; 525/481; 525/485; 525/486; 525/500; 525/507; 525/538; 528/99; 528/108; 528/158; 528/167
(58) Field of Search .......................... 528/99, 108, 158, 528/167; 525/481, 485, 486, 480, 500, 507, 538; 428/413

(56) References Cited

U.S. PATENT DOCUMENTS

| | | | |
|---|---|---|---|
| 3,409,571 A | * | 11/1968 | Shepard |
| 4,010,144 A | * | 3/1977 | Dannels |
| 4,621,123 A | * | 11/1986 | Takagishi |
| 5,240,978 A | * | 8/1993 | Fuhr |
| 5,376,453 A | | 12/1994 | von Gentzkow et al. ... 428/415 |
| 5,458,978 A | | 10/1995 | Bottcher et al. ............ 428/413 |
| 5,506,313 A | | 4/1996 | Flury et al. ................. 525/523 |
| 5,955,184 A | * | 9/1999 | Honda |

* cited by examiner

Primary Examiner—David J. Buttner
(74) Attorney, Agent, or Firm—Edwards & Angell, LLP; Peter F. Corless; Dianne M. Rees

(57) ABSTRACT

A phosphorus-containing polymer having phenolic units and an epoxy rein composition are provided. The epoxy resin composition suitably comprises an epoxy resin and a hardener, wherein the epoxy resin may be obtained by reacting the polymer with epihalohydrin, and the polymer may further act as the hardener.

6 Claims, No Drawings

PHOSPHORUS-CONTAINING POLYMER HAVING PHENOLIC UNITS AND USES THEREOF

FIELDS OF THE INVENTION

This invention relates to a phosphorus-containing polymer having phenolic units and its uses. Such phosphorus-containing polymer is useful as a hardener of an epoxy resin composition, and, after being reacted with an epihalohydrin, as an epoxy resin component as well. The products obtained from the phosphorus-containing polymer of this invention have the flame retardant properties of the UL94V-O standard and high heat resistance, and do not contain toxic substances such as halogen or diantimony trioxide.

BACKGROUND OF THE INVENTION

Because of easy processing, high safety, excellent mechanical and chemical properties, the composite material, especially the epoxy resin material, has been widely used m the field of coating, electrical insulation, construction building mat adhesives and laminated entities. Particularly, since epoxy resins have strong adhesion to reinforcement material such as glass-fiber fabric, no volatiles and small Tankage of the product while hardening, a laminated plate produced by such resins has the advantage of a broad range of usability, good mechanical strength, good electrical insulation characteristics and excellent resistance to chemicals, etc., and has been massively applied to electrical and electronic products.

However, since the demand for finer circuits and higher density of the printed circuit board is increasing day by day, it has been necessary to develop a laminated plate with better electrical, mechanical, and heat resistant processing properties. Widely used at present, he glass mansion temperature (Tg) after hardening of FR4 laminate plate is generally about 130° C. Thus, when the temperature of cutting and drilling is over 200° C. during the production process of a printed circuit board and over 270° C. during the welding process, the plate breaks or cracks easily. Therefore, various laminated plate materials which emphasize high heat stability and high glass transition temperature are constantly being developed. In addition, another important requirement for the laminated plate to possess is the flame retardant properties. The flame retardant properties of a printed circuit board are absolutely necessary, because safety of life and property are involved as the printed circuit board is frequently used in airplanes, automobiles and public transportation.

In order to ensure the flame retardant properties in the laminated plate, substances that separate the flame and decrease burning should be introduced. For laminated plates of epoxy resin/glass-fiber systems, halogen-containing compounds, especially bromine-containing epoxy resins and hardeners, are used, in combination with flame retardants such as diantimony trioxide, etc., so that the achievement of flame retardant standards (as strict as the UL94V-O level) in the laminated plates can be attained However, when epoxy resins reach the level of the UL94V-O standard, in combination with diantimony trioxide or other flame retardants, the bromine content can be as high as 17 to 21%. Diantimony trioxide has been considered as a carcinogen. While bromine generates not only erosive free radicals and hydrogen bromide, aromatic compounds with high bromine content also produce toxic furan bromides and dioxine bromide compounds during the burning process. Thus, the health of the human body and the environment are seriously affected. These are some of the most serious problems in recycling and handling these laminated plates and why it is most urgent to find a novel flame retardant material which can ameliorate the pollution problems resulting from the laminated plates at present.

Phosphorus compounds have been extensively studied and applied to the new generation of flame retardants designed for environmental protection. For example, red phosphorus- or phosphorus-containing organic compounds (such as triphenyl phosphate, tricresyl phosphate, phosphoric acid, etc.) are used as flame retardants to replace halogen compounds to improve the flame retardant properties of the high molecular material or hardened-type resins. However, when these kinds of compounds are added directly to the resin, massive amounts are needed, and the characteristics of the resin material, such as electrical properties, are adversely affected, resulting in difficulties in practice. Recently, for the sake of environmental protection and safety, phospho-epoxy resins have been used to replace bromo-epoxy resins to obtain flame retardant laminated plates. For example, U.S. Pat. No. 5,376,453 has disclosed laminated plate made from epoxy-containing phosphates in combination with nitrogen-containing cyclic hardeners. However, various phosphate epoxides have been added in order to make up for the insufficient phosphorus content and to reach the hardly achievable UL94V-O standard. In U.S. Pat. No. 5,458,978, where epoxy phosphates in combination with nitrogen-containing epoxy resins and metal complexes are used as hardeners, the glass transition temperature of the products is about 175° C., and the flame rest properties only reach the edge of UL94V-O (42 seconds, as opposed to the critical value of 50 seconds). U.S. Pat. No. 5,506,313 has related disclosures as well. However, in these patents, the required flame retardant properties and high heat resistance cannot be reached. The present inventors aim to correct the defects of the conventional techniques and have made extensive studies to complete this invention.

DETAILED DESCRIPTION OF THE INVENTION

This invention relates to a phosphorus-containing polymer having phenolic units and its uses. The polymer can be used to produce prepregs, composite material, laminated entities, printed circuit boards, electronic packaging material, etc. It has the flame retardant properties and high heat resistance.

This invention discloses a novel phosphorus-containing polymer having phenolic units, where the feature of the polymer is comprised of the following repeating units:

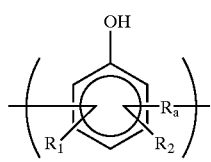

(a)

when $R_1$ and $R_2$ may be the same or different and independently represent H, a $C_{1-20}$alkyl group, a phenoxy group, a phenyl-$C_{1-4}$alkyl group or a phenyl-$C_{1-4}$alkyl group wherein a hydroxy group is substituted on the benzene ring, and $R_a$ represents a single bond, a phenylene group which may be substituted with a

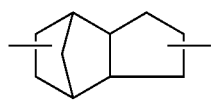

or —C($R_3$)H—, wherein $R_3$ represents H, a $C_{1-4}$alkyl group, $CH_2$=CH, phenyl, furanyl, a $C_{1-4}$alkyl-phenyl group or a $C_{1-4}$alkyl-phenyl group wherein a hydroxy group is substituted on the benzene ring;

(b) a phosphorus-containing repeating unit which is selected from any one of the following formulae (b1) or (b2):

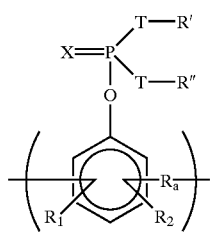

(b1)

wherein $R_1$, $R_2$ and $R_a$ are defined as above,
X represents an oxygen atom or an ion pair
T represents an oxygen atom or a chemical linkage, and
R' and R" may be the same or different and independently represent a $C_{1-18}$alkyl group, phenyl and a phenyl-$C_{1-6}$alkyl group, or R' and R" can be combined together, so that

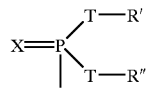

represents

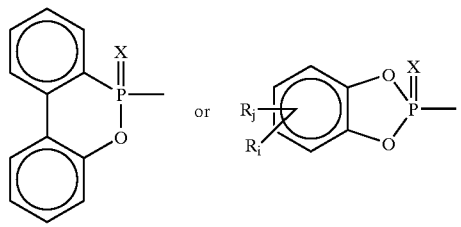

wherein $R_i$ and $R_j$ may be the same or different and independently represent a hydrogen atom or a $C_{1-18}$alkyl group, or

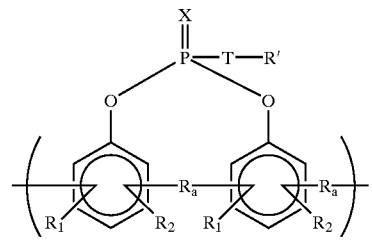

(b2)

wherein each symbol is defined as above; and
an unit of the following formula (c), which is an optional component:

(c)

wherein $R_b$ represent H, a $C_{1-4}$alkyl group, $CH_2$=CH, phenyl, furanyl, a $C_{1-4}$alkyl-phenyl group or a $C_{1-4}$alkyl-phenyl group wherein a hydroxy group is substituted on the benzene ring, and
wherein Y represents

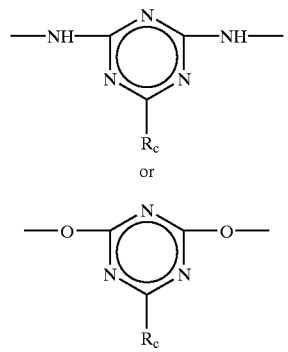

wherein $R_c$ represented $NH_2$, OH, a $C_{1-10}$alkyl group, phenyl or benzoyl.

The phosphorus-containing polymer having phenolic units of this invention is useful as a hardener of an epoxy resin composition. Therefore, this invention also discloses an epoxy resin composition, which contains the phosphorus-containing polymer having phenolic units of this invention which acts as a hardener.

Further, this invention also discloses a phosphorus-containing epoxy polymer having phenolic units, which is obtained by reacting the phosphorus-containing polymer having phenolic units of this invention with an epihalohydrin.

Furthermore, this invention also discloses an epoxy resin composition, which contains the phosphorus-containing epoxy polymer having phenolic units of this invention as an epoxy resin component.

Still further, this invention also discloses an epoxy resin composition, which contains the phosphorus-containing polymer of this invention as a hardener and contains the phosphorus-containing epoxy polymer of this invention as an epoxy resin component.

The epoxy resin composition disclosed in this invention can be coordinated with silica-enforced material—without using halides—by the conventional method, via kneading, pulverizing, and tablet pressing into electronic packaging material, then molding by hot-pressing, to obtain an electronic package which meets the requirements for environmental protection. The electronic package thus obtained is able to meet or even be far superior to the standards of the present products in the market in respect to flame retardant effect, heat stability, size stability and electrical properties, and is suitable for producing electrical products for electronics, space and transport and in manufacturing printed circuit boards and multi-layer circuit boards.

In this invention, the epihalohydrin used to react with the phosphorus-containing polymer having phenolic units to obtain the phosphorus-containing epoxy polymer having phenolic units includes, for example, epichlorohydrin and epibromohydrin.

Examples of the $C_{1-4}$alkyl group of "a $C_{1-4}$alkyl group", "a $C_{1-4}$alkyl-phenyl group" or "a $C_{1-4}$alkyl-phenyl group wherein a hydroxy group is substituted on the benzene ring" represented by $R_a$ and $R_b$ include, for example, methyl, ethyl, n-propyl, isopropyl, n-butyl, s-butyl, t-butyl, etc.

Examples of the $C_{1-6}$alkyl group of "a phenyl-$C_{1-6}$alkyl group" represented by R' and R" include those exemplified above for a $C_{1-4}$alkyl group, and pentyl, hexyl, etc.

Examples of a $C_{1-10}$alkyl group represented by $R_c$ include those exemplified above for a $C_{1-6}$alkyl group, and heptyl, octyl, nonyl, decyl, etc.

Examples of a $C_{1-18}$alkyl group represente[0084] by R' and R" include those exemplified above for a $C_{1-10}$alkyl group, and undecyl, dodecyl, tridecyl, tetradecyl, pentadecyl, hexadecyl, heptadecyl, octadecyl, etc.

Examples of a $C_{1-20}$alkyl group represented by $R_1$ and $R_2$ include those exemplified above for a $C_{1-18}$alkyl group, and nondecyl, eicosyl, etc.

The repeating unit (a) of the phosphorus-containing polymer having phenolic units of this invention is derived from phenolic resins, such as phenolic resin, phenyl phenolic resin, cresol phenolic resin, xylenol phenolic resin, phenol phenolic resin, isobutylphenol phenolic resin, nonylphenol phenolic resin, bisphenol A phenolic resin, bisphenol F phenolic resin, bisphenol phenolic resin, melamine phenolic resin and polyhydric phenols having the following repeating unit:

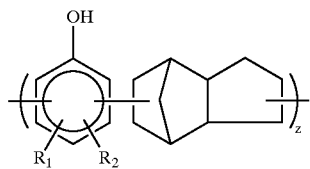

wherei[008e] $R_1$ and $R_2$ are defined as above, and z is an integer from 1 to 10.

The repeating unit (b1) of the phosphorus-containing polymer having phenolic units of this invention is derived from the products of reacting the above-mentioned phenolic resins with a phosphorus-chlorine functional group-containing compound of the following formula:

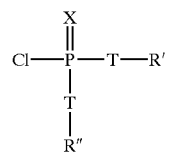

wherein each symbol is defined as above.

The repeating unit (b2) of the phosphorus-containing polymer having phenolic units of this invention is derived from the products of reacting the above-mentioned phenolic resins with a phosphorus-chlorine functional group-containing compound of the following formula:

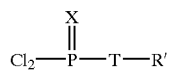

wherein each symbol is defined as above.

The repeating unit (c) which is an optional component of the phosphorus-containing polymer having phenolic units of this invention is derived from melamines, cyanuric acids and guanamines such as benzoguanamine, and the like.

The epoxy resins used m the epoxy resin composition which contains the phosphorus-containing polymer having phenolic units of this invention as a hardener, may be epoxy compounds containing or not containing phosphorus. The preferred examples thereof include, for example, glycidyl ethers, glycidyl amines, glycidyl thioethers, glycidyl carbonyl esters, etc. of bisphenol, phenol, dihydroxybenzene, biphenol, naphthalene, nitrogen-containing hetero rings, phenolics, siloxanes, polysiloxanes, etc.

Examples of diglycidyl ethers of bisphenols include bisphenol A glycidyl ether, bisphenol F glycidyl ether, bisphenol AD glycidyl ether, bisphenol S glycidyl ether, tetramethyl bisphenol A glycidyl ether, tetramethyl bisphenol F glycidyl ether, tetramethyl bisphenol AD glycidyl ether, tetramethyl bisphenol S glycidyl ether, tetrabromobisphenol A diglycidyl ether, etc. The glycidyl amines, glycidyl thioethers, glycidyl carbonyl esters, etc. of such bisphenols may also be used.

Examples of glycidyl ethers of biphenyls include, for example, 4,4'-biphenyl glycidyl ether, 3,3'-dimethyl-4'-biphenyl glycidyl ether, or 3,3',5,5'-tetramethyl4,4'-biphenyl glycidyl ether, etc. The glycidyl amines, glycidyl thioethers, glycidyl carbonyl esters, etc. of such biphenyls may also be used.

Examples of glycidyl ethers of dihydroxybenzenes include, for example, resorcinol glycidyl ether, quinol glycidyl ether, isobutylquinol glycidyl ether, etc. The glycidyl amines, glycidyl thioethers, glycidyl carbonyl esters, etc. of such dihydroxybenzenes may also be used.

Examples of polyglycidyl ethers of phenolics include, for example, phenolic polyglycidyl ether, cresol phenolic polyglycidyl ether, bisphenol A phenolic polyglycidyl ether, etc. The glycidyl amines, glycidyl thioethers, glycidyl carbonyl esters, etc. of such phenolics may also be used.

Examples of glycidyl ethers of nitrogen-containing hetero rings include, for example, glycidyl ethers of melamines, glycidyl ethers of cyanuric acids, glycidyl ether of benzoguanamine, etc. The glycidyl amines, glycidyl thioethers, glycidyl carbonyl esters, etc. of such nitrogen-containing hetero rings may also be used.

The polyglycidyl ethers of other polyhydric phenols may also be used, for example, tris(4-hydroxyphenyl)methane polyglycidyl ether, tris(4-hydroxyphenyl)ethane polyglycidyl ether, tris(4-hydroxyphenyl)propane polyglycidyl ether, tris(4-hydroxyphenyl)butane polyglycidyl ether, tris (3-methyl-4-hydroxyphenyl)methane polyglycidyl ether, tris(3,5-dimethyl-4-hydroxyphenyl)methane polyglycidyl ether, tetrakis(4-hydroxyphenyl ethane polyglycidyl ether, tetrakis(3,5-dimethyl-4-hydroxyphenyl)ethane polyglycidyl ether, etc.

Mixtures of the above-mentioned various epoxy compounds may also be used.

Among the above-mentioned epoxy compounds, the preferred examples are those having two functional groups such as bisphenol A glycidyl ether, resorcinol glycidyl ether, etc., those having three functional groups such as tris(4-hydroxyphenyl)methane polyglycidyl ether, etc., and those having four functional groups such as tetrakis(4-hydroxyphenyl)ethane polyglycidyl ether, cresol phenolic polyglycidyl ether, etc., and mixtures thereof.

The examples of other epoxy compounds include, for example, various epoxy compounds obtained by directly oxidizing compounds having a double bond structure with hydrogen peroxide, including dicyclopentadiene epoxides,

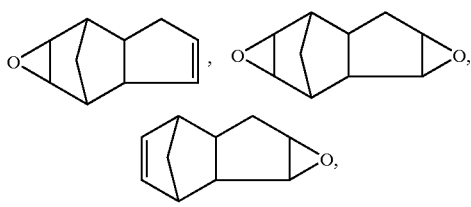

epoxides of styrene derivatives and epoxy compounds of cycloalkenes. These can also be used in the composition of this invention.

Depending on the final properties desired for the epoxy resin composition of this invention, in addition to using the above-mentioned phosphorus-containing polymer of this invention as a hardener, optionally, conventional hardeners not containing phosphorus may be used.

The so-called hardeners not containing phosphorus in this invention include, for example, compounds containing an active group which can react with an epoxy group, the examples thereof being, for example, amines, bisphenols, dihydroxybenzenes, polyhydric phenols, phenolics, naphthalene, siloxanes, polysiloxanes, polythiols, polycarboxylic acids, etc. or mixture thereof.

Examples of suitable amines include, for example, dicyanodiamide and diaminodiphenylmethane, etc.

Examples of suitable bisphenols include, for example, bisphenol A, bisphenol F, bisphenol AD, bisphenol S, tetramethyl bisphenol A, tetramethyl bisphenol F, tetramethyl bisphenol AD, tetramethyl bisphenol S, etc.

Examples of suitable polyhydric phenols include, for example, tris(4-hydroxyphenyl)methane, tris(4-hydroxyphenyl)ethane, tris(4-hydroxyphenyl)propane, tris (4-hydroxyphenyl)butane, tris(3-methyl-4-hydroxyphenyl) methane, tris(3,5-dimethyl-4-hydroxyphenyl)methane, tetrakis(4-hydroxyphenyl)ethane, or tetrakis(3,5-dimethyl-4-hydroxyphenyl)ethane, etc.

Examples of suitable phenolics include, for example, phenol-formaldehyde condensate, cresol phenolic condensate, bisphenol A phenolic condensate and a phenolic condensate of melamine-phenol.

This invention also relates to an epoxy resin composition, which is comprised of, as the epoxy resin component a phosphorus-containing epoxy polymer having phenolic unit obtained by reacting the phosphorus-containing polymer having phenolic unit of this invention with an epihalohydrin, and a hardener.

In this epoxy resin composition, in addition to containing a phosphorus-containing epoxy polymer having phenolic units as the epoxy resin component, it may also contain the above-mentioned epoxy compounds containing or not containing phosphorus as the epoxy resin component.

The hardener used in this epoxy resin composition may be the phosphorus-containing polymer having phenolic units of this invention, or the above-mentioned conventional hardeners not containing phosphorus.

In the epoxy resin composition of this invention, the added amount of the hardeners depends on the equivalent weight of the reactive hydrogen in the hardeners and the epoxy equivalent weight of the epoxy resin. Usually, the equivalent weight of the reactive hydrogen in the hardeners is 10 to 100%, preferably 50 to 90%, when the epoxy equivalent weight of the epoxy resin is taken as 100%.

The epoxy resin composition of his invention can be applied in the fields of high heat resistant materials, for example, laminated entities, IC packaging material, high heat resistant powder coating, engineering plastics, etc.

Optionally, hardening promoters, solvents, catalysts and other additives may also be added in the epoxy resin composition of this invention The hardening promoters employed in this invention are, for example, tertiary amines, tertiary phosphines, quaternary ammonium salt, quaternary phosphonium salts, imidazole compounds, etc. These hardening promoters can be used alone or two or more of them can be mixed.

The tertiary amines include, for example, triethylamine, tributylamine, dimethylethanolamine, tris(N,N,-dimethylaminomethyl)phenol, N,N-dimethylaminocresol, etc.

The tertiary phosphines include, for example, triphenylphosphine.

The quaternary ammonium salts include, for example, tetramethylammonium chloride, tetramethylammonium bromide, tetramethylammonium iodide, triethylbenzylammonium chloride, triethylbenzylammonium bromide, triethylbenzylammonium iodide, etc.

The quaternary phosphonium salts include, for example, tetrabutylphosphonium chloride, tetrabutylphosphonium bromide, tetrabutylphosphonium iodide, tetrabutylphosphonium acetate complex, tetraphenylphosphonium chloride, tetraphenylphosphonium bromide, tetraphenylphosphonium iodide, ethyltriphenylphosphonium chloride, ethyltriphenylphosphonium bromide, ethyltriphenylphosphonium iodide, ethyltriphenylphosphonium acetate complex, ethyltriphenylphosphonium phosphate complex, propyltriphenylphosphonium chloride, propyltriphenylphosphonium bromide, propyltriphenylphosphonium iodide, butyltriphenylphosphonium chloride, butyltriphenylphosphonium bromide, butyltriphenylphosphonium iodide, etc.

The imidazole compounds include, for example, 2-methylimidazole, 2-phenylimidazole, 2-ethyl-4- methylimidazole, 2-laurylimidazole and 2-heptadecylimidazole.

The preferred hardening promoters are imidazole compounds and quaternary phosphonium salts; especially preferable are 2-methylimidazole, 2-phenylimidazole, ethyltriphenylphosphonium acetate complex and butyltriphenylphosphonium.

If a hardening promoter is used, the suitable amount used thereof is 0.005 to 5.0 weight %, preferably 0.05 to 4.5 weight %, more preferably 0.1 to 4.0 weight %, and most preferably 0.15 to 3.0 weight %, based on the total weight of the epoxy resin composition of this invention.

Excessive amount of the hardening promoter may reduce the reaction time, but by-products are easily formed and may result in a negative effect on the application of the products. For example, in the application of products such as laminated entities of printed circuit boards, excessive amount of the hardening promoter may result in poor electrical properties, humidity trance and moisture absorption. On the other hand, if too little an amount is added, the reaction rate will be slow and not beneficial in the industrial application.

In the epoxy resin composition of this invention, the viscosity of the composition can be adjusted by the addition of a solvent as well. The viscosity can be suitably adjusted to the range of 20 to 500 cps/25° C.

The solvents which can be used are, for example, aromatic hydrocarbons, ketones, protic solvents, ethers and ester, etc.

The aromatic hydrocarbons include, for example, toluene and xylene.

The ketones include, for example, acetone, methyl ethyl ketone and methyl isobutyl ketone.

The protic solvents include, for example, N,N-dimethylformaide, N,N-diethylformaide and dimethylsulfoxide.

The ethers include, for example, ethylene glycol monomethyl ether and propylene glycol monomethyl ether.

The esters include, for example, ethyl acetate and ethyl isoproanate.

The catalysts used in the epoxy resin composition of this invention include, for example, 10% triphenylphosphine solution in methanol (catalyst A), etc.

Other additives which may be used in this invention are conventional additives in this art, for example, modifiers, heat stabilize, light stabilizers, UV absorbents and plasticizers.

This invention also relates to the use of the epoxy resin composition in the fields of high heat resistant materials, for example, laminated entities, IC packaging material, electronic packaging material, high heat resistant powder coating, engineering plastics, etc. In addition, the epoxy resin composition of this invention can be impregnated with substrate material by an impregnating method and formed into prepregs. The base material used for impregnating may be organic or inorganic material, for example, paper, mass, metal, carbon fiber, boron fiber, cellophane and organic high molecules.

The epoxy resin composition of this invention can be manufactured by conventional methods into laminated entities which comprise copper foil, fiber support and the epoxy resin composition of this invention. For example, glass fiber fabric can be impregnated into the epoxy resin composition of this invention. Then, the impregnated glass fiber fabric is dried by heating, and a dried prepreg is obtained. When the obtained prepreg is stored at room temperature for several months, the stage stability is excellent. The prepreg can further be formed into composite material laminated plates, or it can be used alone in a binding layer of prepregs. As well, copper foil is placed on one surface or both surfaces of a prepreg or a combination of more prepregs, which is then pressurized and heated to obtain a laminated plate. The laminated plate thus obtained is by far superior to the standards of the present products in the market in respect to size stability, resistance to chemicals, resistance to corrosion, moisture absorption and electrical properties, and is suitable in producing electrical products for electronics, space and transport, and in manufacturing printed circuit boards and multi-layer circuit boards.

Summarily, this invention provides a novel phosphorus-containing polymer having phenolic units, the epoxy polymer thereof and the epoxy resin compositions comprised of such polymers, with excellent flame retardant, heat resistance and mechanical properties.

This invention will be further described with reference to the following Examples, but the scope of this invention is by no means limited.

The epoxy equivalent weight and the solid content hereinafter are measured by the following methods:

Epoxy equivalent weight (EEW): the epoxy resin is dissolved in a mixed solvent (chlorobenzene:chloroform= 1:1), then the is titrated with HBr/glacial acetic acid. EEW is determined according to the method in ASTM D1652. The indicator used is crystal violet.

Viscosity: A novolac sample of the epoxy resin composition is placed into a thermostated trough at 25° C. for 4 hours, and the viscosity is measured by a Brookfield viscosimeter at 25° C.

Solid content: After baking a novolac sample of the epoxy resin composition at 150° C. for 60 minutes, non-volatiles in weight % are determined, which is the solid content.

Phenolic resin A: is a phenolic condensate sold under trade name PF5110 and manufactured by Chang Chun Plastics Co., Ltd., Taiwan. The hydroxy equivalent weight is 108 g/eq.

Phenolic resin B: is a phenolic condensate containing melamine residue, sold under trade name Melane 9000 and manufactured by Hitachi Kasei Co. in Japan. The hydroxy equivalent weight is 118 g/eq.

Epoxy resin 1: is a diglycidyl ether of bisphenol A, sold under trade name BE188EL and manufactured by Chang Chun Plastics Co., Ltd, Taiwan. The epoxy equivalent weight is in the range of 185 to 195 g/eq, the hydrolytic chlorine is under 200 ppm, and the viscosity thereof is in the range of 11,000 to 15,000 cps/25° C.

Epoxy resin 2: is a dilyglycidyl ether of tetrabromobisphenol A, sold under trade name BEB530A80 and manufactured by Chang Chun Plastics Co., Ltd., Taiwan. The epoxy equivalent weight is in the range of 430 to 450 g/eq and bromine content is in the range of 18.5 to 20.5 weight %.

Epoxy resin 3 is a diglycidyl ether of tetrabromobisphenol A, sold under trade name BEB526A80 and manufactured by Chang Chun Plastics Co., Ltd., Taiwan. The epoxy equivalent weight is in the range of 410 to 430 g/eq and bromine content is in the range of 19.0 to 21.0 weight %.

Epoxy resin 4 is an epoxy resin sold under trade name CNE-200T and manufactured by Chang Chun Plastics Co., Ltd., Taiwan. The epoxy equivalent weight is 200 g/eq.

Harden A represents a solution of 10% dicyanodiamide in DMF.

Catalyst A represents a solution of 10% triphenylphosphine in methanol.

Hardening promoter represents a solution of 10% 2-methylimidazole in DMF.

SYNTHESIS EXAMPLE 1

Synthesis of Phosphorus-containing Polymer A Having Phenolic Units—which Contains Repeating Units (a) and (b).

Phosphorus oxychloride ($POCl_3$) (615 g) and anhydrous magnesium chloride (5.4 g) were added into a 3-liter, 5-necked flask equipped with temperature and pressure-containing and indicating apparatus. The temperature was raised to 100° C., and phenol (750 g) was added at a constant rate in 2 hours. When the addition was completed, the reaction was continued for 2 hours. Subsequently, phenolic resin A (OH equivalent weight 108 g/eq) was added at the same temperature and the reaction was continued further for 2 hours. Then, methyl ethyl keton (1000 g) was added. After being washed with distilled water three times, the solvent was distilled off under reduced pressure, and 1670 g of pale yellow phosphorus-containing polymer A having phenolic units was obtained. The OH equivalent weight thereof was 442 g/eq.

SYNTHESIS EXAMPLE 2

Synthesis of Phosphor-containing Polymer B Having Phenolic Units—which Contains Repeating Units (a), (b) and (c).

Phosphorus-containing polymer B having phenolic units was obtained according to the same manner as Synthesis Example 1, except that phenolic resin A was replaced by phenolic resin B (OH equivalent weight 120 g/eq, contains melamine residue). The OH equivalent weight thereof was 460 g/eq.

SYNTHESIS EXAMPLE 3

Synthesis of Phosphorus-containing Polymer C Having Phenolic Units—which Contains Repeating Units (a) and (b).

Phosphorus-containing polymer C having phenolic units was obtained according to the same manner as Synthesis Example 1, except that phenolic resin A was replaced by bisphenolA-phenolic resin (phenolic resin C, OH equivalent weight 120 g/eq). The OH equivalent weight thereof was 482 g/eq.

The phosphorus containing resins which contain an epoxy group and have phenolic structure were synthesized by the following Synthesis Examples 4 and 5.

SYNTHESIS EXAMPLE 4

Synthesis of Phosphorus-containing Epoxy Polymer A Having Phenolic Unit.

A 3-liter, 5-necked flask equipped with temperature and pressure-controlling and indicating apparatuses and an apparatus wherein the co-distilling mixture of water and an epihalohydrin can be condensed and separated was used as the reactor. Phosphorus-containing resin A having phenolic units obtained in Synthesis Example 1 (700 g) and epichlorohydrin (880 g) were added into the flask. After the obtained mixture was stirred in atmospheric pressure until homogeneouly dissolved, it was heated to 70° C. at 190 mmHg absolute pressure, and 49.3% sodium hydroxide solution (154.7 g) was added at a constant rate in 4 hours under equilibrium temperature and pressure. After the reaction was completed, epichlorohydrin and the solvent remained were distilled off under reduced pressure. The epoxy resin crude product obtained was dissolved in a solution of methyl ethyl ketone and de-ionized water. Sodium chloride remaining in the resin was washed off with water. Subsequently, methyl ethyl ketone was distilled off under reduced pressure, and 780 g of pale brown The epoxy equivalent weight thereof was 468 g/eq.

SYNTHESIS EXAMPLE 5

Synthesis of Phosphorus-containing Epoxy Polymer B Having Phenolic Units.

Phosphorus-containing epoxy polymer B having phenolic units was obtained according to the same manner as Synthesis Example 4, except at the phosphorus-containing polymer A having phenolic units was replaced by the phosphorus-containing polymer B having phenolic units obtained in Synthesis Example 2. The epoxy equivalent weight thereof was 490 g/eq.

WORKING EXAMPLE 1 TO 6 AND COMPARATIVE EXAMPLES 1 TO 2

The formulae of the epoxy resin compositions in this invention are shown in Table 1 as Working Examples 1 to 6. Comparative Examples 1 and 2 are control groups.

The above-synthesized phosphorus-containing epoxy polymers, hardener, hardening promoter and solvent are formulated at room temperature according to the addition ratios shown in Table 1 into the phosphorus containing epoxy resin compositions in a vessel equipped with a mixer and a condenser:

TABLE 1

Composition formula of each Working Example and Comparative Example.

| Composition Formula (g) | Working Example 1 | Working Example 2 | Working Example 3 | Working Example 4 | Working Example 5 | Working Example 6 | Comparative Example 1 | Comparative Example 2 |
|---|---|---|---|---|---|---|---|---|
| P-containing Epoxy Polymer A in Synthesis Example 4 | 180 | | | | | | | |
| P-containing Epoxy Polymer B in Synthesis Example 5 | | 180 | | | | | | |
| Epoxy Resin 1 | | | 160 | 140 | 100 | 150 | | |
| Epoxy Resin 2 | | | | | | | 125 | |
| Epoxy Resin 3 | | | 40 | | | | | 125 |
| P-containing Polymer A in Synthesis Example 1 | | | | | 200 | 240 | | |
| P-containing Polymer B in Synthesis Example 2 | 190 | | 190 | 210 | | | | |
| Hardener A | 40 | 180 | | | | 15 | 250 | 260 |
| Catalyst A | 1 | 1 | 1 | 1 | 1 | 1 | | |
| Hardening Promoter | | | | | | | 0.625 | 0.625 |

Properties Test

A glass-fiber fabric was impregnated in the phosphorus-containing epoxy resin compositions prepared in the above working and comparative Examples, then dried at 150° C. so that preregs were formed. The glass transition temperature was measured by DSC (differential scanning calorimeter, TA2910), the situation of heat loss was determined by thermogravimetric analysis (TGA), and the flame retardant property was measured by a flame test. The results are shown in Table 2. It is seen from Table 2 that, while the prepregs obtained from the composition of this invention have the flame retardant properties, the heat loss temperature and the glass transition temperature are also increased.

TABLE 2

Flame retardant properties, heat stability and glass-transition temperatures of prepregs after baking at 180° C. for 120 minutes.

| | Working Example 1 | Working Example 2 | Working Example 3 | Working Example 4 | Working Example 5 | Working Example 6 | Comparative Example 1 | Comparative Example 2 |
|---|---|---|---|---|---|---|---|---|
| Flame Test* | V-O | V-O | V-O | V-O | V-O | V-O | V-O | V-O |
| 1% Heat Loss Temperature | 305 | 312 | 310 | 330 | 303 | 301 | 250 | 250 |
| Tg (° C.) | 185 | 193 | 198 | 185 | 205 | 207 | 132 | 150 |

Note:
*Flame test: according to the method of UL94V-O.

Eight pieces of each of the above prepregs were piled up individually. A sheet of 35 μm copper foil was placed on the top and bottom sides, which were laminated at 185° C., under a pressure of 25 kg/cm², and formed into laminated entities of the prepregs and the glass fiber fabric. The results of the test of various physical properties are given in Table 3. It is known from Table 3 that, all the test items of the composition in this invention meet the required standards.

TABLE 3

Results of physical properties test on plates after laminated by heating.

| Test Item | Condition and Spec. | Working Example 1 | Working Example 2 | Working Example 6 | Comparative Example 2 |
|---|---|---|---|---|---|
| Solder Resistance | IPC 260° C. spec. >10 | Pass | Pass | Pass | Pass |
| Peeling Strength | IPC spec. >8 lb/in | 8.50 | 8.70 | 8.70 | 8.90 |
| Surface Resistance | IPC spec. >$10^{12}$ | $2.57 \times 10^{15}$ | $2.25 \times 10^{15}$ | $4.56 \times 10^{15}$ | $3.57 \times 10^{15}$ |
| Volume Resistance | IPC spec. >$10^{10}$ | $1.08 \times 10^{14}$ | $9.56 \times 10^{13}$ | $1.87 \times 10^{14}$ | $1.06 \times 10^{14}$ |
| Dielectric Constant | IPC spec. <5.4 | 4.5 | 4.6 | 4.6 | 4.6 |
| Dissipation Factor | — | 0.018 | 0.020 | 0.018 | 0.020 |
| Tg (° C.) | DSC | 190 | 203 | 210 | 153 |

As is known from the above, the prepregs obtained from the composition of this invention and the laminated entities thereof have the flame retardant properties, and the glass transition temperature is more preferable where it is at least 190° C. or even more than 200° C. The physical properties of the products, which include solder resistance, peeling strength, surface resistance, volume resistance, dielectric constant and dissipation factor, are able to meet or are even superior to the required specifications.

WORKING EXAMPLES 7 TO 8 COMPARATIVE EXAMPLES 3 TO 4

The phosphorus-containing epoxy resin composition in this invention can be formulated into the packaging materials of Working Examples 7 and 8 in accordance with the formulae shown in Table 4. Comparative Examples 3 and 4 are control groups. After various components of each formula were well-mixed and crushed, they were kneaded with a double-roller kneading machine, then pulverized and tablet pressed to obtain packaging material. Molding and properties tests were carried out for each packaging material; the results are shown in Table 5.

TABLE 4

Formulae of phosphorus-containing packaging material compositions.

| Composition Formula (g) | Working Example 7 | Working Example 8 | Comparative Example 3 | Comparative Example 4 |
|---|---|---|---|---|
| Epoxy Resin 4 | 540 | — | 790 | 790 |
| P-containing Epoxy Polymer B in Synthesis Example 5 | — | 620 | — | — |
| Epoxy Resin 2 | — | — | — | 3 |
| P-containing Polymer A in Synthesis Example 1 | 650 | — | — | — |
| Phenolic Resin | — | 400 | 400 | 400 |
| Fused Silica | 2800 | 2800 | 2800 | 2800 |
| Catalyst A | 5.2 | 5.2 | 5.2 | 5.2 |
| Silane | 14.2 | 14.2 | 14.2 | 14.2 |
| Carbon Black | 7.2 | 7.2 | 7.2 | 7.2 |
| Wax | 11 | 11 | 11 | 11 |
| $Sb_2O_3$ | — | — | — | 7.2 |

TABLE 5

Properties test of phosphorus-containing packaging material after molding.

| Item | Condition | Working Example 7 | Working Example 8 | Comparative Example 3 | Comparative Example 4 |
|---|---|---|---|---|---|
| Molten State Viscosity | 175° C. | 50 poise | 52 poise | 79 poise | 83 poise |
| Gelling Time | 160° C. | 28 sec. | 27 sec. | 28 sec. | 29 sec. |
| Flame Retardant Properties | UL 94 V-O | Pass | Pass | Failure | Pass |
| Flow Rate | — | 70 cm | 68 cm | 59 cm | 55 cm |
| Tg | DSC | 165° C. | 167° C. | 160° C. | 163° C. |

As is apparent from Table 5, the packaging material prepared by the compositions in this invention are superior to those of the Comparative Examples in respect to the molten state viscosity, gelling time, flame retardant property, flow rate and the glass transition temperature after molding.

What is claimed is:

1. An epoxy resin composition, which is comprised of:

(A) an epoxy resin obtained by reacting the repeating unit of the following formula:

(a)

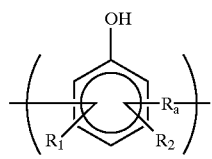

wherein $R_1$ and $R_2$ may be the same or different and independently represent H, a $C_{1-20}$ alkyl group, a phenoxy group, a phenyl-$C_{1-4}$ alkyl group or a phenyl-$C_{1-4}$ alkyl group wherein a hydroxy group is substituted on the benzene ring, and $R_a$ represents

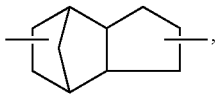

or —C($R_3$)H—, wherein $R_3$ represents H, a $C_{1-4}$ alkyl group, $CH_2$=CH, phenyl, furanyl, a $C_{1-4}$ alkyl-phenyl group or a $C_{1-4}$ alkyl-phenyl group wherein a hydroxy group is substituted on the benzene ring with an epihalohydrin; and (B) a hardener which is a phosphorus-containing polymer having the following repeating units:

(a)

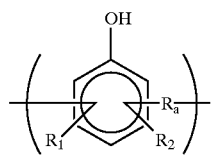

wherein $R_1$ and R2 may be the same or different and independently represent H, a $C_{1-20}$ alkyl group, a phenoxy group, a phenyl-$C_{1-4}$ alkyl group or a phenyl-$C_{1-4}$ alkyl group wherein a hydroxy group is substituted on the benzene ring, and $R_a$ represents

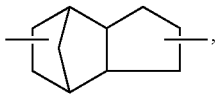

or —C($R_3$)H—, wherein $R_3$ represents H, a $C_{1-4}$ alkyl group, $CH_2$=CH, phenyl, furanyl, a $C_{1-4}$ alkyl phenyl group or C1–4 alkyl phenyl group wherein a hydroxy group is substituted on the benzene ring;

(b) a phosphorus-containing repeating unit which is selected from the group consisting of (b1)

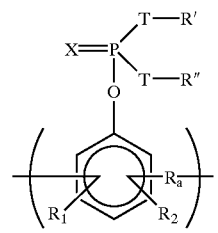

wherein $R_1$, $R_2$, and $R_3$ are defined as above,

X represents an oxygen atom or an ion pair

T represents an oxygen atom or a chemical linkage, and

R' and R" may be the same or different and independently represent a $C_{1-18}$ alkyl group, phenyl and a phenyl-$C_{1-6}$ alkyl group, or R' and R" can be combined together, so that

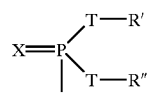

represents

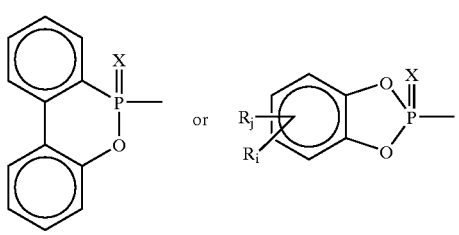

wherein $R_i$ and $R_j$ may be the same or different and independently represent a hydrogen atom or a $C_{1-8}$ alkyl group; or

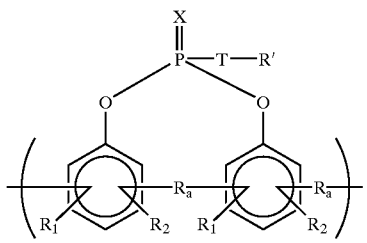

wherein R1, R2, R', and Ra are defined as above; and a unit of the following formula (c) which is an optional component:

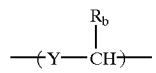

(c)

wherein $R_b$ represents H, a $C_{1-4}$ alkyl group, $CH_2=CH$, phenyl, furanyl, a $C_{1-4}$ alkyl-phenyl group or a $C_{1-4}$ alkyl-phenyl group wherein a hydroxy group is substituted on the benzene ring, and wherein Y represents

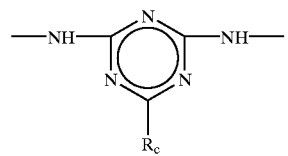

-continued
or

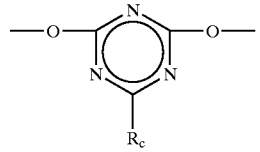

and wherein $R_c$ represents $NH_2$, OH, a $C_{1-10}$ alkyl group, phenyl or benzoyl.

2. The epoxy resin composition according to claim 1, wherein said composition further comprises a hardening promoter.

3. The epoxy resin composition according to claim 2, wherein said hardening promoter is selected from the group consisting of tertiary amines, tertiary phosphines, quaternary ammonium salts, quaternary phosphonium salts and imidizole compounds.

4. The epoxy resin composition according to claim 2, wherein the content of said hardening promoter is 0.005 to 5.0 weight % of the total weight of the epoxy composition.

5. An electronic packaging material comprising an epoxy resin material of claim 1.

6. A printed circuit board substrate comprising an epoxy resin material of claim 1.

* * * * *